(12) United States Patent
Sinha et al.

(10) Patent No.: US 9,252,791 B1
(45) Date of Patent: Feb. 2, 2016

(54) PHASE LOCKED LOOP AND METHOD FOR GENERATING AN OSCILLATOR SIGNAL

(71) Applicants: Anand Kumar Sinha, Noida (IN); Deependra K. Jain, Noida (IN); Krishna Thakur, Greater Noida (IN)

(72) Inventors: Anand Kumar Sinha, Noida (IN); Deependra K. Jain, Noida (IN); Krishna Thakur, Greater Noida (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/580,136

(22) Filed: Dec. 22, 2014

(51) Int. Cl.
*H03L 7/06* (2006.01)
*H03L 7/099* (2006.01)

(52) U.S. Cl.
CPC ..................................... *H03L 7/099* (2013.01)

(58) Field of Classification Search
None
See application file for complete search history.

(56) References Cited

U.S. PATENT DOCUMENTS

| | | | | |
|---|---|---|---|---|
| 5,600,272 A * | 2/1997 | Rogers | .................. | H03L 7/0891 327/103 |
| 5,696,468 A * | 12/1997 | Nise | ........................ | H03L 7/099 327/156 |
| 7,154,348 B2 | 12/2006 | Lee | | |
| 7,420,427 B2 | 9/2008 | Brown | | |
| 7,710,206 B2 * | 5/2010 | Kelkar | .................. | H03L 7/0995 327/157 |
| 7,742,553 B1 | 6/2010 | Bataineh | | |
| 7,898,343 B1 | 3/2011 | Janesch | | |
| 7,907,022 B2 | 3/2011 | Thakur | | |
| 8,253,458 B2 | 8/2012 | Sinha | | |
| 8,373,460 B2 | 2/2013 | Sinha | | |
| 2003/0076140 A1 * | 4/2003 | Asano | ........................ | H03L 7/10 327/157 |
| 2008/0061895 A1 * | 3/2008 | Kelkar | .................. | H03L 7/0995 331/57 |
| 2008/0136474 A1 * | 6/2008 | Okada | ................... | H03L 7/0805 327/156 |
| 2008/0186066 A1 * | 8/2008 | Jung | ..................... | H03L 7/0896 327/157 |
| 2010/0134163 A1 * | 6/2010 | Kawamoto | ................ | H03L 7/18 327/157 |
| 2011/0234276 A1 * | 9/2011 | Kaneko | ................... | H03L 7/099 327/157 |

* cited by examiner

*Primary Examiner* — Cassandra Cox
(74) *Attorney, Agent, or Firm* — Charles E. Bergere

(57) ABSTRACT

A phase locked loop (PLL) system generates an oscillator signal by providing a fixed control voltage to a programmable voltage to current converter having switch selection inputs and a variable current output. Logic values are provided to the switch selection inputs to adjust a control current at the variable current output and a frequency of the oscillator signal is adjusted based on the control current. The logic values are fixed when a first condition is reached, which is based on the frequency of the oscillator signal, a division factor, and an input reference signal frequency. The fixed control voltage provided to the programmable voltage to current converter is then replaced with a charge pump control voltage based on an error signal. The error signal is based on a comparison of the input reference signal frequency and a fraction of the oscillating frequency.

20 Claims, 4 Drawing Sheets

PHASE LOCKED LOOP AND METHOD FOR GENERATING AN OSCILLATOR SIGNAL

BACKGROUND OF THE INVENTION

The present invention relates generally to a system and method for generating an oscillator signal and, more specifically, to a phase-locked loop (PLL) system and method for generating an oscillator signal.

A PLL is a system that generates an oscillator signal having a constant phase relationship with an input reference signal. PLL systems are widely used in various applications such as radio, telecommunications, computers, and other electronic applications. A PLL system includes a voltage-controlled oscillator (VCO) for generating the oscillator signal based on a control voltage, and a phase detector for comparing the phase of the oscillator signal with that of the input reference signal and for generating an error signal based on the detected phase difference. The PLL system also includes a loop filter for filtering the error signal and generating the control voltage. Thereafter, the control voltage is provided to the VCO.

Generally, PLL systems are expected to operate over a wide range of frequencies and over a wide range of process, voltage and temperature (PVT) variations. To operate over a wide range of frequencies, a common practice is to increase the VCO gain. However, the increase in VCO gain over large output frequency range makes the VCO more susceptible to phase noise. Further, lack of immunity to phase noise results in high output jitter. Thus, approaches to calibrating VCO gain in PLL systems have been developed.

In certain PLL systems, input reference signal frequency may be tracked using a charge pump circuit. The charge pump circuit generates a charge pump current based on the error signal generated by the phase detector. However, this approach does not reduce the gain of the VCO. Further, to control variations in VCO gain, additional components must be included, which increases the size of the PLL system.

To minimize the gain of the VCO over a wide operating range, external calibration circuits are used for calibrating the VCO. During calibration, the calibration circuit coarse tunes the VCO close to a locking frequency, while keeping the PLL system in an open loop. Thereafter, the VCO is fine tuned to the locking frequency by closing the loop. The gain of the VCO is minimized as the VCO is primarily tuned by the calibration circuit. However, the calibration of the VCO does not help in reducing variations in VCO gain with respect to PVT variations. The gain variations result in variable phase margin and bandwidth, thereby leading to unstable operation of the PLL system. Further, PLL systems that use such external calibration circuits typically require a current reference sources, biased noise filtering and other extra circuitry thereby increasing the footprint of the PLL system and adding additional noise creating nodes.

At lower supply voltages, the dynamic range of control voltages for a PLL system is limited. Hence, for a wide output frequency range a PLL system needs an adaptable frequency calibration technique. Generally, PLL calibration techniques require circuits including a current reference, a biased noise filter and DAC current source to achieve the desired frequency/performance. Being coupled to a VCO also adds extra noise to the PLL system and the above circuits increases the area and power of the PLL system.

At lower voltage power supplies and extended temperature variations (−40 C to 165 C) with given process corners, the VCO needs to be initialized with greater precision due to a "squeezed" dynamic range of control voltage.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
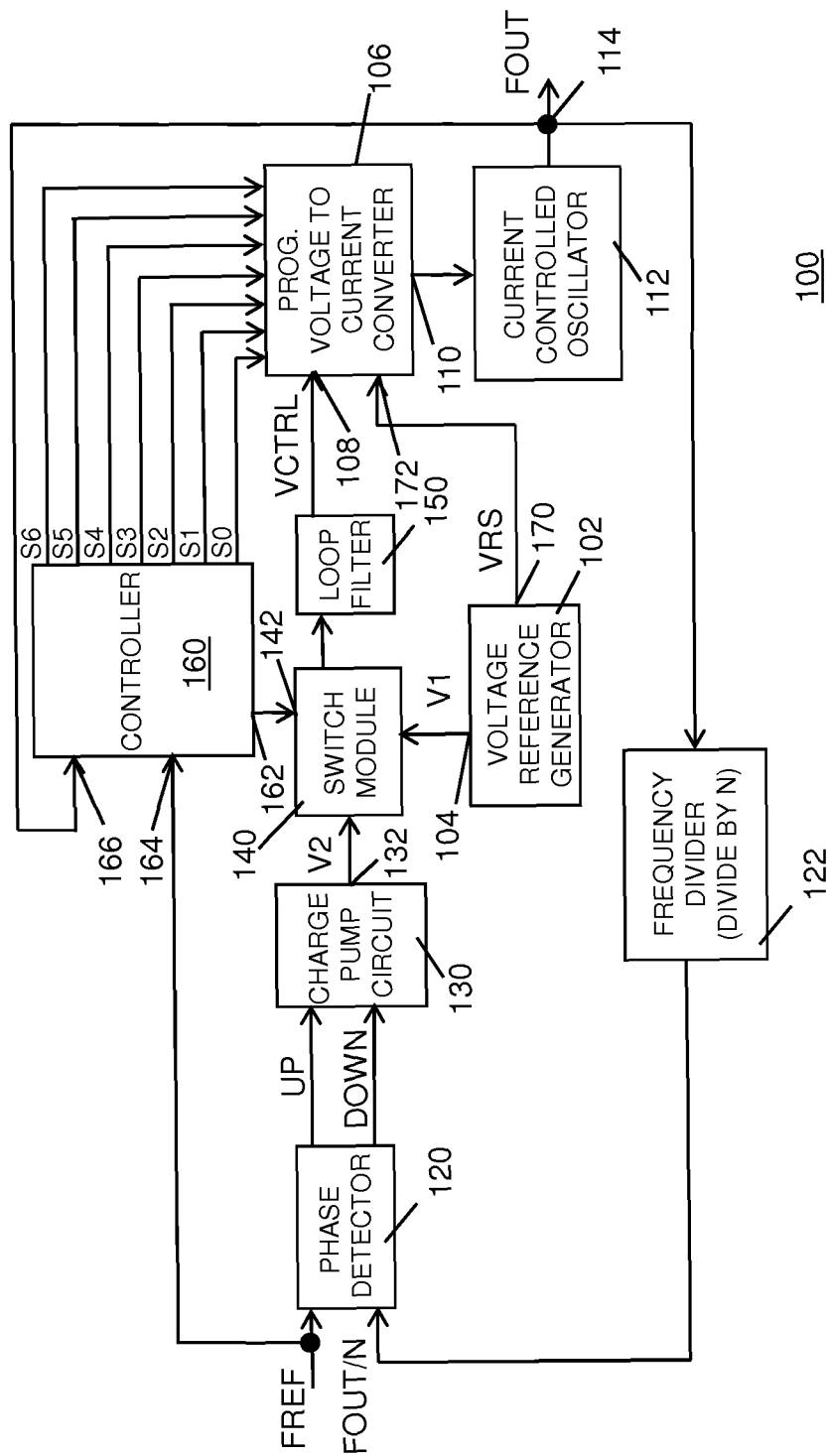
FIG. 1 is a block diagram of a phase-locked loop (PLL) system in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a phase-locked loop (PLL) system comprising a voltage reference generator with a generator control voltage output providing a fixed control voltage. There is a programmable voltage to current converter having a control voltage input, switch selection inputs and a variable current output. The system has a current-controlled oscillator having an oscillator output providing an oscillator signal with an oscillating frequency and an input connected to the variable current output. There is a phase detector coupled to the oscillator output, and the phase detector in operation generates an error signal based on an input reference signal frequency and a fraction of the oscillating frequency. A charge pump circuit is connected to the phase detector, the charge pump circuit having a charge pump output that provides a charge pump control voltage based on the error signal. There is also a switch module configured to selectively couple either the generator control voltage output or the charge pump output to the control voltage input of the programmable voltage to current converter. The system includes a controller with controller outputs coupled to the switch selection inputs and a further output coupled to a selection input of the switch module.

In operation the system initially operates in an open loop configuration when the controller signals the switch module to couple the generator control voltage output to the control voltage input of the programmable voltage to current converter. When in the open loop configuration the controller selectively provides logic values to the switch selection inputs to adjust a frequency of the oscillator signal until a first condition is reached. Thereafter, the system operates in a closed loop configuration when the controller signals the switch module to couple the charge pump output to the control voltage input of the programmable voltage to current converter.

In another embodiment, the present invention provides a method for generating an oscillator signal, the method includes providing a fixed control voltage to a programmable voltage to current converter having switch selection inputs and a variable current output. The method selectively provides logic values to the switch selection inputs to adjust a control current at the variable current output and also performs adjusting a frequency of the oscillator signal based on the control current. There is also performed a fixing of the logic values when a first condition is reached. The first condition is based on the frequency of the oscillator signal, an input reference signal frequency and a division factor. The method then performs replacing the fixed control voltage provided to the programmable voltage to current converter with a charge pump control voltage based on an error signal. The error signal is based on a comparison of the input reference signal frequency and a fraction of the oscillating frequency.

Referring now to FIG. 1, a block diagram of a phase-locked loop (PLL) system 100 in accordance with an embodiment of the present invention is shown. The phase-locked loop (PLL) system 100 includes a voltage reference generator 102 with a generator control voltage output 104 providing a fixed control voltage V1. There is a programmable voltage to current converter 106 having a control voltage input 108, switch selection inputs S0 to S6 and a variable current output 110. In this embodiment the voltage reference generator 102 has a secondary output 170 providing a regulated voltage VRS to a regulated voltage input 172 of the programmable voltage to current converter 106.

The PLL system 100 includes a current-controlled oscillator 112 having an oscillator output 114 providing an oscillator signal with an oscillating frequency FOUT and an input connected to the variable current output 110.

A phase detector 120 is coupled to the oscillator output 114 via a frequency divider 122. In operation, the phase detector generates an error signal ERR based on an input reference signal frequency FREF and a fraction 1/N of the oscillating frequency FOUT. In this embodiment the error signal ERR is provided on two lines UP and DOWN as will be apparent to a person skilled in the art. Also, the fraction 1/N of the oscillating frequency FOUT is provided by a feedback loop which includes the frequency divider 122 (where N is a division factor of the divider 122 and is essentially a denominator value forming the fraction 1/N of the oscillating frequency) connected between the oscillator output 114 and the phase detector 120.

A charge pump circuit 130 is connected to the phase detector 120, the charge pump circuit has a charge pump output 132 that provides a charge pump current resulting in a charge pump control voltage V2 which is based on the error signal ERR. The PLL system 100 also includes a switch module 140 configured to selectively couple either the generator control voltage output 104 or the charge pump output 132, via a low pass loop filter 150, to the control voltage input 108 of the programmable voltage to current converter 106. More specifically, the low pass loop filter 150 is connected between the switch module 140 and the programmable voltage to current converter 106. The low pass loop filter 150 filters either the control voltage V2 resulting from the charge pump circuit 130 or the fixed control voltage V1 to provide a converter control voltage VCTRL to the programmable voltage to current converter 106. There is a controller 160 with controller outputs coupled to the switch selection inputs S0 to S6 and a further output 162 of the controller 160 is coupled to a selection input 142 of the switch module 140. The controller also has a first controller input 164 that receives the input reference signal frequency FREF and a second controller input 166 coupled to the oscillator output 114 thereby receiving the oscillating frequency FOUT.

In operation, at startup, the PLL system 100 initially operates in an open loop configuration. In the open loop configuration the controller 160 signals the selection input 142 of the switch module 140 to couple the generator control voltage output 104, via the low pass loop filter 150, to the control voltage input 108 of the programmable voltage to current converter 106. Consequently the generator control voltage V1 is filtered by the low pass loop filter 150 and becomes the converter control voltage VCTRL. Also, the controller 160 selectively provides logic values to the switch selection inputs S0 to S6 to thereby adjust a frequency of the oscillator signal until a first condition C1 is reached. Once this condition is reached the PLL system operates in a closed loop configuration when the controller 160 signals the selection input 142 of the switch module 140 to couple the charge pump output 132, via the low pass loop filter 150 to the control voltage input of the programmable voltage to current converter 108. As a result when in the closed loop mode the control voltage V2 provided from the charge pump circuit 130 is filtered by the low pass loop filter 150 and becomes the converter control voltage VCTRL.

When in the open loop mode, the controller 160 selectively provides logic values to the switch selection inputs S0 to S6 thereby varying a control current ICTRL at the variable current output 110. The oscillating frequency FOUT is dependent on the control current ICTRL and thus the supplying of the logic values to the switch selection inputs adjusts the oscillating frequency FOUT to achieve the first condition C1. This first condition C1 is a value of the oscillating frequency FOUT that best matches the product of the input reference signal frequency FREF and the division factor N of the frequency divider 122.

Figure 2:
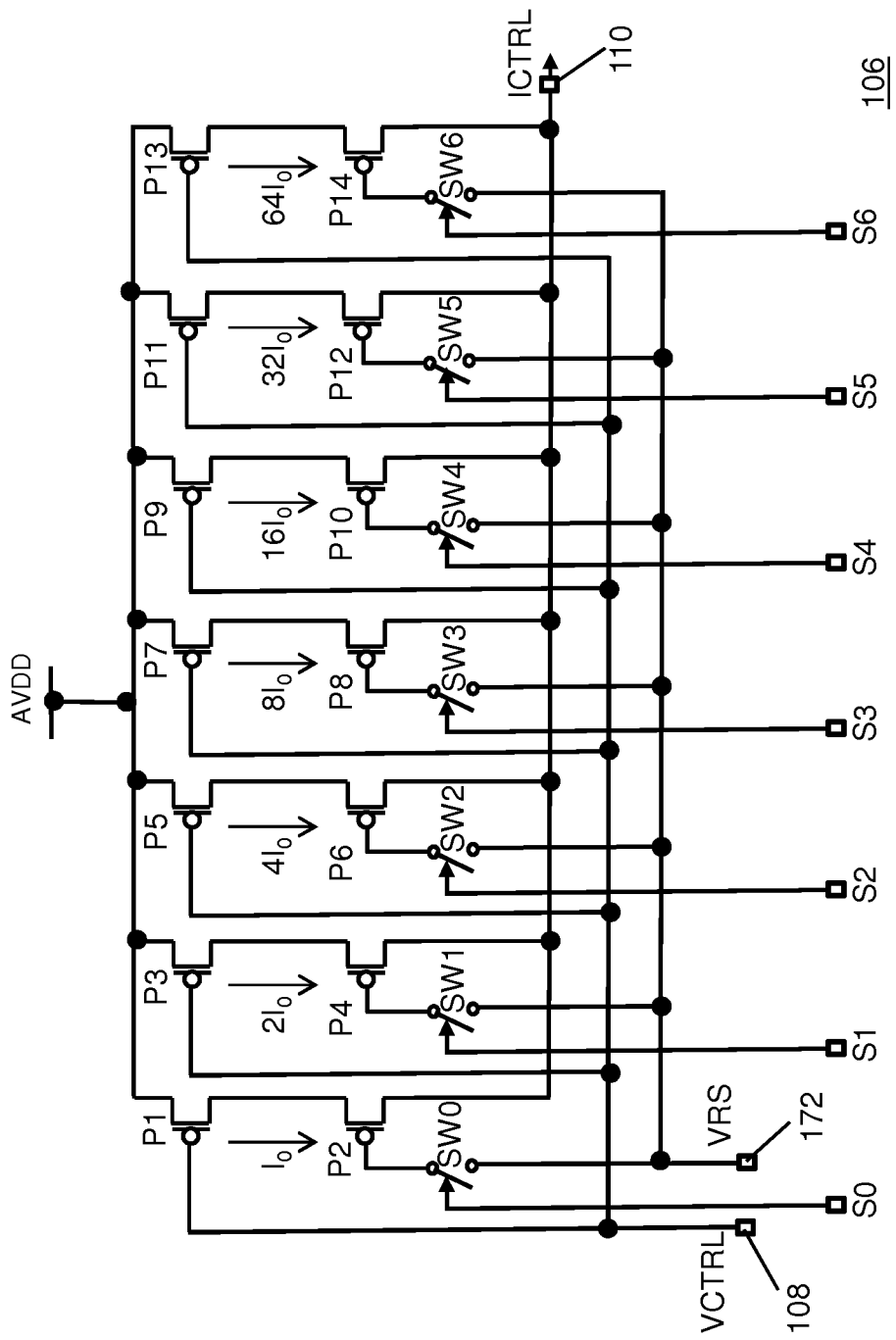
FIG. 2 is a circuit diagram of the programmable voltage to current converter that forms part of the system of FIG. 1, in accordance with an embodiment of the present invention.

Referring to FIG. 2, a circuit diagram of the programmable voltage to current converter 106 in accordance with an embodiment of the present invention is shown. The programmable voltage to current converter 106 includes a bank of parallel switchable current paths Io, 2Io, 4I0, 8I$o$, 16Io, 32Io and 64Io that selectively couple, individually or in combination, a supply rail AVDD to the variable current output 110. Each of the switchable current paths I0 to 64Io includes a respective current limiting transistor P1, P3, P5, P7, P9, P11 or P13 in series with a respective switching transistor P2, P4, P6, P8, P10, P12 or P14. Control electrodes (gates) of all the current limiting transistors P1, P3, P5, P7, P9, P11 and P13 are coupled to the control voltage input 108 and control electrodes (gates) of each switching transistor P2, P4, P6, P8, P10, P12 and P14 are coupled to a respective switch SW0, SW1, SW2, SW3, SW4, SW5 OR SW6. Each of the switches are controlled by one of the switch selection inputs S0 to S6 which selectively close the switches SW0 to SW6 thereby coupling the gates of the switching transistors P2 to P14 to the regulated voltage input 172.

Each of the current limiting transistors P1, P3, P5, P7, P9, P11 and P13 have different aspect ratios in multiples of two, and more specifically: transistor P3 has an aspect ratio twice that of transistor P1; transistor P5 has an aspect ratio twice that of transistor P3; transistor P7 has an aspect ratio twice that of transistor P5; transistor P9 has an aspect ratio twice that of transistor P7; transistor P11 has an aspect ratio twice that of transistor P9; and transistor P13 has an aspect ratio twice that of transistor P11. Hence, for instance, switchable current paths 64Io can conduct 64 times the current of switchable current path Io, 32 times the current of switchable current path 2Io and twice the current of switchable current path 32Io.

Figure 3:
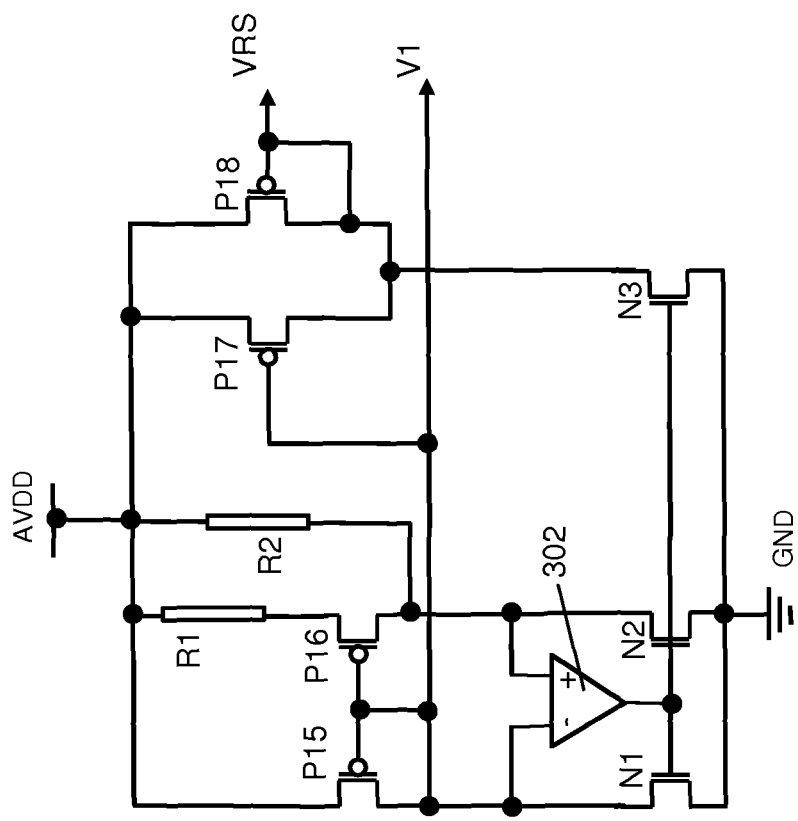
FIG. 3 is a circuit diagram of a voltage reference generator that forms part of the system of FIG. 1.

Referring to FIG. 3, a circuit diagram of the voltage reference generator 102 is shown. The voltage reference generator 102 includes a current mirror provided by a transistor pair P15, P16 with a gate of transistor P15 coupled to its drain electrode. A source electrode of transistor P15 is directly coupled to the supply rail AVDD and a source electrode of transistor P16 is coupled to the supply rail AVDD through a resistor R1. A drain electrode of transistor P16 is coupled to: a ground rail GND through a transistor N2; the supply rail AVDD through a resistor R2 and to a non-inverting input of a amplifier 302. The drain electrode of transistor P15 is coupled to the ground rail GND through a transistor N1 and to an inverting input of the amplifier 302. An output of the amplifier 302 is coupled to the gate electrodes of the transistors N1 and N2 and also to a gate electrode of another transistor N3.

The voltage reference generator 102 also includes two parallel coupled transistors P17, P18 having their source electrodes directly coupled to the supply rail AVDD and their drain electrodes are coupled trough the transistor N3 to the ground rail GND. The gate and drain electrodes of transistor P18 are coupled together and provide the secondary output 170 supplying the regulated voltage VRS. Also, the gate electrode of transistor P17 is coupled to the drain electrode of transistor P15 and provides the control voltage output 104 supplying the fixed control voltage V1. This fixed control voltage V1 provides a suitable initial voltage for the PLL system 100 operation which is beneficial especially for lower supply voltages with a "squeezed" dynamic control voltage range.

Figure 4:
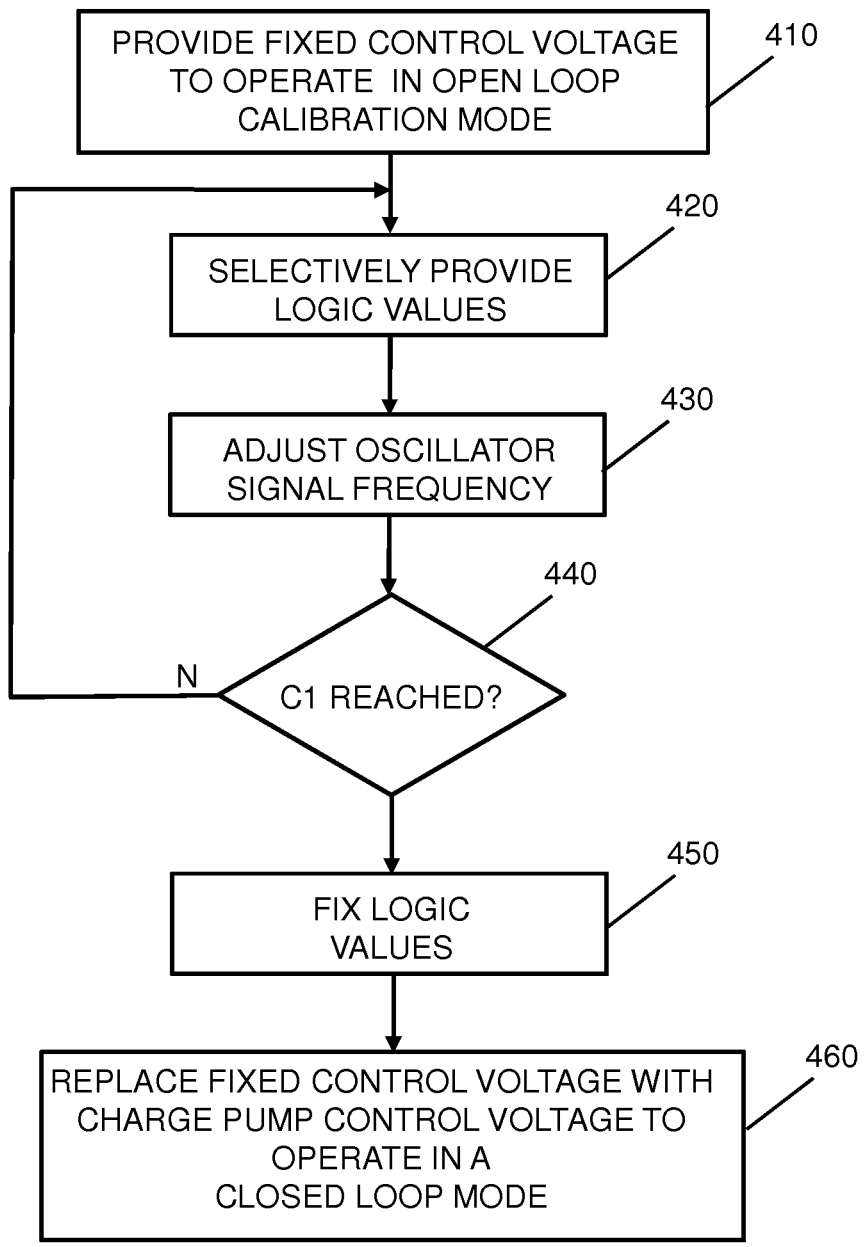
FIG. 4 is a flow chart illustrating a method for generating an oscillator signal in accordance with an embodiment of the present invention.

Referring to FIG. 4, a flow chart of a method 400 for generating an oscillator signal in accordance with an embodiment of the present invention is shown. By way of illustration the method 400 will be described with reference to the PLL system 100. At a providing block 410, a fixed control voltage V1 is processed through the low pass loop filter 150 so the converter control voltage VCTRL is a fixed voltage that is provided to the programmable voltage to current converter 106. At block 420, a process of selectively providing logic values to the switch selection inputs S0 to S6 is performed in order to adjust the control current ICTRL at the variable current output 110.

At an adjusting block 430, the oscillating frequency FOUT is adjusted, this adjusting is based on the control current ICTRL. The oscillating frequency FOUT is dependent on the control current ICTRL and thus the supplying of the logic values to the switch selection inputs S0 to S6 adjusts the oscillating frequency FOUT to achieve the first condition C1. This first condition C1 is a value of the oscillating frequency FOUT that best matches the product of the input reference signal frequency FREF and the division factor N of the frequency divider 122.

A test is then performed at a test block 440 to determine if the first condition C1 is reached. This first condition C1 is reached when the oscillating frequency FOUT best matches the product of the input reference signal frequency FREF and the division factor N of the frequency divider 122. Thus at this point it is not known if the first condition C1 is reached and thus the method iteratively performs the selectively providing, adjusting and determining blocks of 420, 430, 440 until FOUT−FREF×N=MIN VALUE.

Typically, in this iterative approach the selectively providing the logic values is performed by a binary search algorithm that attempts to minimize the difference between the FOUT and the product of FREF and the division factor N. Thus, initially switch SW6 is closed and all other switches SW1-SW5 are open. If at block 440 FOUT<FREF×N then both SW5 and SW6 will be closed and at the next iteration if at block 440 FOUT>FREF×N then SW5 is opened and both SW4 and SW6 are closed. At the next iteration if at block 440 FOUT<FREF×N then SW3, SW4 and SW6 are closed and so on until the first condition C1 is achieved. When the first condition C1 is achieved the method 400, at block 450, fixes the logic values that control the open and closed states of switches SW1 to SW1 that achieve the first condition C1.

At a replacing block 460, a process of replacing the fixed control voltage provided to the programmable voltage to current converter 106 with the charge pump control voltage V2 based on the error signal ERR is performed. The actual control voltage V2 is filtered through the low pass loop filter 150 to become a filtered charged pump voltage that is the converter control voltage VCTRL. As will be apparent to a person skilled in the art, when the replacing block 460 is initiated the charge pump output 132 is connected to the low pass loop filter 150 and the PLL system 100 operates in a closed loop mode to achieve a desired frequency for the oscillator signal and locks the phase with the input reference signal frequency FREF.

Advantageously, the present invention provides for a PLL system that can generate a fixed oscillator signals for a wide range of oscillating frequencies FOUT. The present invention may also assist in providing a relatively small circuit footprint and may assist in reducing noise creating nodes caused by multiple current reference sources.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A phase-locked loop (PLL) system, comprising:
a voltage reference generator with a generator control voltage output providing a fixed control voltage;
a programmable voltage to current converter having a control voltage input, switch selection inputs, and a variable current output;
a current-controlled oscillator (CCO) having an oscillator output providing an oscillator signal with an oscillating frequency and an input connected to the variable current output;
a phase detector, coupled to the oscillator output, wherein in operation the phase detector generates an error signal based on an input reference signal frequency and a fraction of the oscillating frequency;
a charge pump circuit connected to the phase detector, the charge pump circuit having a charge pump output that provides a charge pump control voltage based on the error signal;

a switch module that selectively couples one of the generator control voltage output and the charge pump output to the control voltage input of the programmable voltage to current converter; and a controller with controller outputs coupled to the switch selection inputs and a further output coupled to a selection input of the switch module, wherein in operation the PLL system initially operates in an open loop configuration when the controller signals the switch module to couple the generator control voltage output to the control voltage input of the programmable voltage to current converter and when in the open loop configuration the controller selectively provides logic values to the switch selection inputs to adjust a frequency of the oscillator signal until a first condition is reached and thereafter the PLL system operates in a closed loop configuration when the controller signals the switch module to couple the charge pump output to the control voltage input of the programmable voltage to current converter.

2. The PLL system of claim 1, further comprising a loop filter connected between the switch module and the programmable voltage to current converter.

3. The PLL system of claim 2, wherein the loop filter is a low pass filter.

4. The PLL system of claim 1, further comprising a frequency divider connected between the oscillator output and the phase detector for providing the fraction of the oscillating frequency.

5. The PLL system of claim 1, wherein the first condition is based on the frequency of the oscillator signal.

6. The PLL system of claim 5, wherein the first condition is a value of the oscillating frequency that best matches the product of the input reference signal frequency and a division factor.

7. The PLL system of claim 6, wherein the division factor is a denominator value forming the fraction of the oscillating frequency.

8. The PLL system of claim 1, wherein the programmable voltage to current converter includes a bank of parallel switchable current paths.

9. The PLL system of claim 8, wherein the parallel switchable current paths include a current limiting transistor and each having a different aspect ratio.

10. The PLL system of claim 9, wherein the different aspect ratios are in multiples of two.

11. A method for generating an oscillator signal, the method comprising:

providing a fixed voltage to a programmable voltage to current converter having switch selection inputs and a variable current output;

selectively providing logic values to the switch selection inputs to adjust a control current at the variable current output;

adjusting a frequency of the oscillator signal based on the control current;

fixing the logic values when a first condition is reached, wherein the first condition is based on the frequency of the oscillator signal, an input reference signal frequency, and a division factor; and replacing the fixed control voltage provided to the programmable voltage to current converter with a charge pump control voltage based on an error signal, wherein the error signal is based on a comparison of the input reference signal frequency and a fraction of the oscillating frequency.

12. The method of claim 11, wherein the fixed control voltage and the charge pump control voltage are supplied to the programmable voltage to current converter through a loop filter.

13. The method of claim 12, wherein the loop filter is a low pass filter.

14. The method of claim 11 wherein the first condition is a value of the oscillating frequency that best matches the product of the input reference signal frequency and the division factor.

15. The method of claim 14, wherein the division factor is a denominator value forming the fraction of the oscillating frequency.

16. The method of claim 11, wherein the programmable voltage to current converter includes a bank of parallel switchable current paths.

17. The method of claim 16, wherein the parallel switchable current paths include a current limiting transistor and each having a different aspect ratio.

18. The method of claim 17, wherein the different aspect ratios are in multiples of two.

19. The method of claim 11, wherein the selectively providing logic values is performed by a binary search algorithm that reduces the difference between the value of the oscillating frequency and the product of the input reference signal frequency and a division factor.

20. The method of claim 11, wherein the replacing results in a closed loop mode operation to achieve a desired frequency for the oscillator signal which is locked in phase with the input reference signal frequency.

* * * * *